US 6,637,087 B1

(12) United States Patent
Horiuchi et al.

(10) Patent No.: US 6,637,087 B1
(45) Date of Patent: Oct. 28, 2003

(54) METHOD OF PRODUCING EDGE REFLECTION TYPE SURFACE ACOUSTIC WAVE DEVICE

(75) Inventors: Hideya Horiuchi, Kyoto (JP); Michio Kadota, Kyoto (JP); Junya Ago, Nagaokakyo (JP); Seigo Hayashi, Komatsu (JP); Yasunori Takakuwa, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/528,467

(22) Filed: Mar. 17, 2000

(30) Foreign Application Priority Data

Mar. 18, 1999 (JP) ............................. 11-073801

(51) Int. Cl.⁷ .............................................. H04R 17/00
(52) U.S. Cl. ......................... 29/25.35; 29/594; 29/595; 29/609.1; 29/834; 29/835; 310/313; 310/320; 310/366; 333/150; 333/187; 333/193; 333/195; 333/196
(58) Field of Search ............................... 29/25.35, 594, 29/595, 609.1, 834, 835; 333/150, 187, 193, 195, 196; 310/313, 320, 366

(56) References Cited

U.S. PATENT DOCUMENTS

| 4,307,356 A | * | 12/1981 | Arai | 333/194 |
| 4,387,355 A | * | 6/1983 | Uno | 333/195 |
| 4,635,009 A | * | 1/1987 | Ebata | 333/195 |
| 4,757,283 A | * | 7/1988 | Greer | 333/195 |
| 5,010,270 A | * | 4/1991 | Greer | 310/313 D |
| 5,091,051 A | * | 2/1992 | Greer | 156/643 |
| 5,099,459 A | * | 3/1992 | Smith | 367/153 |
| 5,260,913 A | * | 11/1993 | Kadota | 367/140 |
| 5,283,037 A | * | 2/1994 | Baer | 422/82.01 |
| 5,684,437 A | * | 11/1997 | Ago | 333/195 |
| 5,729,186 A | | 3/1998 | Seki et al. | 333/194 |
| 5,793,147 A | * | 8/1998 | Kadota | 310/313 |

FOREIGN PATENT DOCUMENTS

| EP | 0 795 958 A2 | 9/1997 |
| JP | 62-145881 | 6/1987 |
| JP | 63-115408 | 5/1988 |
| JP | 2-230809 | 9/1990 |
| JP | 2-305207 | 12/1990 |
| JP | 6-112526 | 4/1994 |
| JP | 7-50538 | 2/1995 |
| JP | 9-199448 | 9/1997 |
| JP | 10-83974 | 3/1998 |
| JP | 10-230516 | 9/1998 |

* cited by examiner

Primary Examiner—A. Dexter Tugbang
Assistant Examiner—Paul Kim
(74) Attorney, Agent, or Firm—Keating & Bennett, LLP

(57) ABSTRACT

A method of manufacturing an edge reflection type surface acoustic wave device includes the step of preparing a surface acoustic wave mother substrate having a plurality of inter-digital transducers formed on one main surface thereof. A cut groove is formed in the substrate by cutting the surface acoustic wave mother substrate beginning from the one main surface side thereof. This step of forming a cut groove is repeated so as to produce a plurality of cut grooves so that the first reflection edge of the respective surface acoustic wave devices are sequentially formed. Next, similarly, cut grooves are sequentially formed on the surface acoustic wave mother substrate from the one main-face side thereof so as not to reach the other main surface thereof, whereby the second reflection edges of the respective surface acoustic wave devices are sequentially formed.

34 Claims, 4 Drawing Sheets

METHOD OF PRODUCING EDGE REFLECTION TYPE SURFACE ACOUSTIC WAVE DEVICE

BACKGROUND OF THE INVENTION

1. Field of the Invention

The present invention relates to a method of producing a surface acoustic wave device for use in a resonator, a bandpass filter, or other such apparatus, and more particularly, to a method of producing an edge reflection type surface acoustic wave device utilizing an SH type surface acoustic wave.

2. Description of the Related Art

In recent years, different types of edge reflection type surface acoustic wave devices for which no reflectors are required have been proposed. FIG. 3 is a perspective view showing an edge reflection type surface acoustic wave resonator as an example of the above-described edge reflection type surface acoustic wave devices. In an edge reflection type surface acoustic wave resonator 1, an interdigital transducer (hereinafter, referred to as IDT) 3 is formed on the upper side of a rectangular surface acoustic wave substrate 2. The IDT 3 has a pair of interdigital electrodes 3a and 3b. The interdigital electrode 3a has plural electrode fingers $3a_1$, and $3a_2$. The interdigital electrode 3b has plural electrode fingers $3b_1$ and $3b_2$. The electrode fingers $3a_1$, $3a_2$, and the electrode fingers $3b_1$, $3b_2$ are arranged so as to be inserted between each other in an interdigitated manner. In the edge reflection type surface acoustic wave device 1, the surface acoustic wave substrate 2 has a first edge 2a and a second edge 2b disposed opposite to each other. When an AC voltage is applied to the IDT 3, the SH type surface acoustic wave is generated. The SH type surface acoustic wave is propagated in the direction passing through the first edge 2a and the second edge 2b, and is reflected by the edges 2a, 2b.

Accordingly, it is unnecessary to provide reflectors on the opposite sides of the IDT 3 in the surface acoustic wave propagation direction, so that the surface acoustic wave device can be miniaturized.

Further, in Japanese Unexamined Patent Publication No. 7-50538, an example of the method of producing an edge reflection-type surface acoustic wave device is described. The above-described prior-art production method will be explained with reference to FIG. 4.

First, a surface acoustic wave mother substrate 51 shown in FIG. 4 is prepared. Plural IDTs 53 are formed on one side main surface 51a of the surface acoustic wave mother substrate 51. The IDTs 53 correspond to the IDTs 3 of the edge reflection type surface acoustic wave resonators 1, respectively. In the case of the edge reflection type surface acoustic wave resonator, it is necessary to form a reflection edge from which a surface acoustic wave is reflected with very high precision.

Thus, according to the above-described prior art method, the first and second reflection edges are provided by forming cut grooves on the surface acoustic wave mother substrate 51 from one side main surface 51 a thereof after the IDTs 53 are formed. More concretely, cut grooves each having a width T shown in FIG. 4 are formed, for which a blade with a thickness T is used to form cut grooves 54A and 54B. In this case, the inner side walls of the grooves 54A and 54B which lie on the IDT 53 sides thereof constitute the first and second reflection edges, respectively. That is, in FIG. 4, the straight lines A1, A2, A3—and the straight lines B1, B2, B3—indicate the positions of the inner side walls on the IDT 53 sides of the above-described grooves 54A and 54B, that is, the positions of the first and second reflection edges, respectively.

As described in Japanese Unexamined Patent Publication No. 7-50538, it is necessary that the interval L, which is equal to the distance between lines B1 and A2, of the cutting lines along which the above-described surface acoustic wave substrate 51 is cut is set at a larger value than the thickness T of the blade. That is, it is described that the cut grooves 54A and 54B can be easily formed by setting L>T.

Further, according to the above-described prior art method, the cut groove 54A is formed along the cutting line A1 shown in FIG. 4, and thereafter, the cut groove 54B is formed along the cutting line B1. In this manner, the cutting is carried out along the cutting lines A1, B1, A2, B2, and A3 in that order, respectively. In particular, when the cutting process for forming the first and second reflection edges on the surface acoustic wave substrate 51 is carried out, a cutting device is fed sequentially from one end of the surface acoustic wave substrate 51 to the other end thereof in the direction passing through the first and second reflection edges.

However, when the cutting device is fed in the direction passing through the first and second reflection edges to carry out the above-described cutting, a feeding-quantity C by which the cutting device is fed for the next cutting along the cutting line B1 after the substrate 51 is cut along the cutting line A1, and a feeding-quantity D by which the cutting device is fed for cutting along the cutting line A2 after the substrate 51 is cut along the cutting line Bt are considerably different from each other. Thus, the cutting device can not be fed sequentially at an equal pitch for cutting. That is, it is necessary to carry out the cutting while the feeding-pitch of the cutting device is changed.

In this case, unless the feeding-quantities C and D are accurately controlled, the distances between the first and second reflection edges of the respective edge reflecting type surface acoustic wave resonators become different, and thereby, dispersions in resonance characteristic occur. Accordingly, it has been necessary to use an expensive cutting device with which the feeding-pitch can be easily changed, and moreover, the feeding pitch can be accurately set. In addition, the change of the feeding-pitch is very difficult, and the productivity is low.

It is possible that the surface acoustic wave substrate 51 is formed so that the above-described feeding quantities C and D become equal- to each other. However, if the feeding quantities C and D are equal, the portion of the surface acoustic wave substrate which becomes eventually unnecessary, that is, the surface acoustic wave substrate portion sandwiched between the cutting line B1 and the cutting line A2, is increased in size. Thus, the number of edge reflection type surface acoustic wave resonators which can be formed by use of the surface acoustic wave substrate 51 with a predetermined size is decreased and also, the productivity is reduced.

SUMMARY OF THE INVENTION

To overcome the problems described above, preferred embodiments of the present invention provide a method of producing an edge reflection type surface acoustic wave device, in which the process of forming reflection edges, carried out when individual edge reflection type surface acoustic wave devices are formed from a surface acoustic wave mother substrate, is improved, and many edge reflecting type surface acoustic wave devices can be efficiently produced with a high productivity.

According to one preferred embodiments of the present invention, the method of producing an edge reflection type surface acoustic wave device having first and second reflection edges opposed to each other preferably includes the steps of preparing a surface acoustic wave mother substrate having a plurality of IDTs formed on one surface side thereof, repeating the process of forming a cut groove on the surface acoustic wave mother substrate from one main surface side thereof whereby the first reflection edges of the respective surface acoustic wave devices are sequentially formed, and rep eating the process of forming a cut groove on the surface acoustic wave mother substrate from the one main surface side thereof whereby the second reflection edges of the respective surface acoustic wave devices are sequentially formed.

According to preferred embodiments of the present invention, since all of the distances between the first reflection end surfaces of adjacent end surface reflection type surface acoustic wave device portions and the distances between the second reflection end surfaces thereof are substantially equal to each other, the cutting can be carried out by feeding the cutting device or the surface acoustic wave substrate at an equal pitch in the process of forming the first reflection end surfaces and in the process of forming the second reflection end surfaces. Thus, the productivity is greatly improved, and moreover, the first and second reflection end surfaces are formed with high precision.

Accordingly, an end surface reflection type surface acoustic wave device which is inexpensive, has less dispersions in resonance characteristics, and has a high reliability is achieved.

It is preferable that in the process of forming the first reflection edges sequentially and in the process of forming the second reflection edges sequentially, a cutting device or the surface acoustic wave mother substrate is fed sequentially in the direction passing through the first and second reflection edges whereby the first or the second reflection edges are sequentially formed. The feeding-pitch of the cutting device and the surface acoustic wave mother substrate can be set to a constant value.

It is also preferable that the method further includes the step of rotating the surface acoustic wave mother substrate by 180 degrees about the axis passing through the centers of both the main surfaces of the surface acoustic wave mother substrate after the first edges are sequentially formed, whereby the second reflection edges are formed sequentially on the rotated surface acoustic wave mother substrate. The cutting device can be sequentially fed at an equal pitch to form the second reflection end surfaces after the first reflection end surfaces are formed. In addition, the first reflection end surfaces and the second reflection end surfaces can be formed via the same side of a cutting blade of the cutting device. Thus, an end surface reflection type surface acoustic wave device of which the resonance characteristic has minimal dispersions is achieved.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
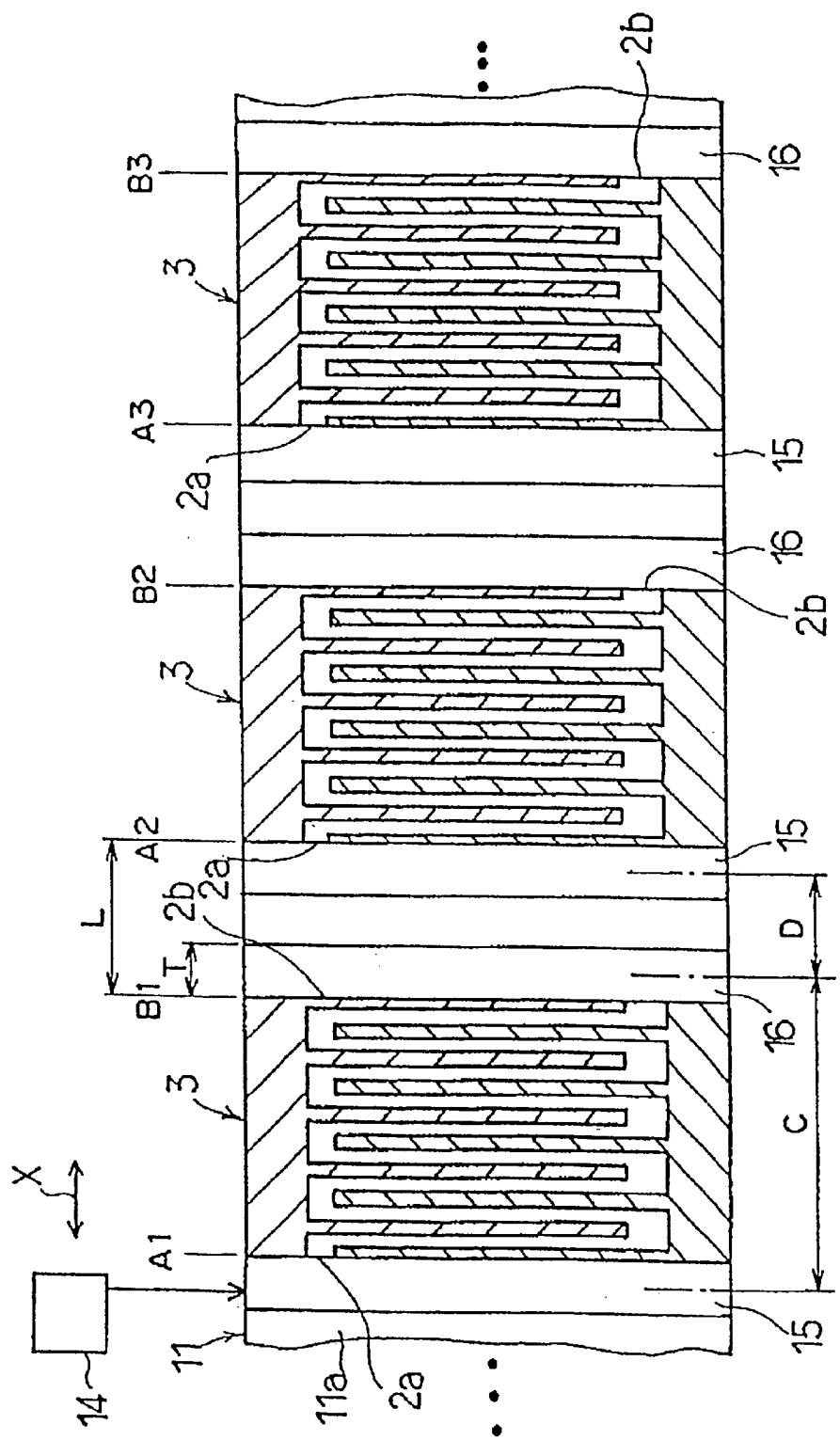
FIG. 1 is a plan view showing a method of producing an edge reflection type surface acoustic wave device according to a preferred embodiment of the present invention, in which the process of cutting a surface acoustic wave mother substrate is explained.
Figure 3:
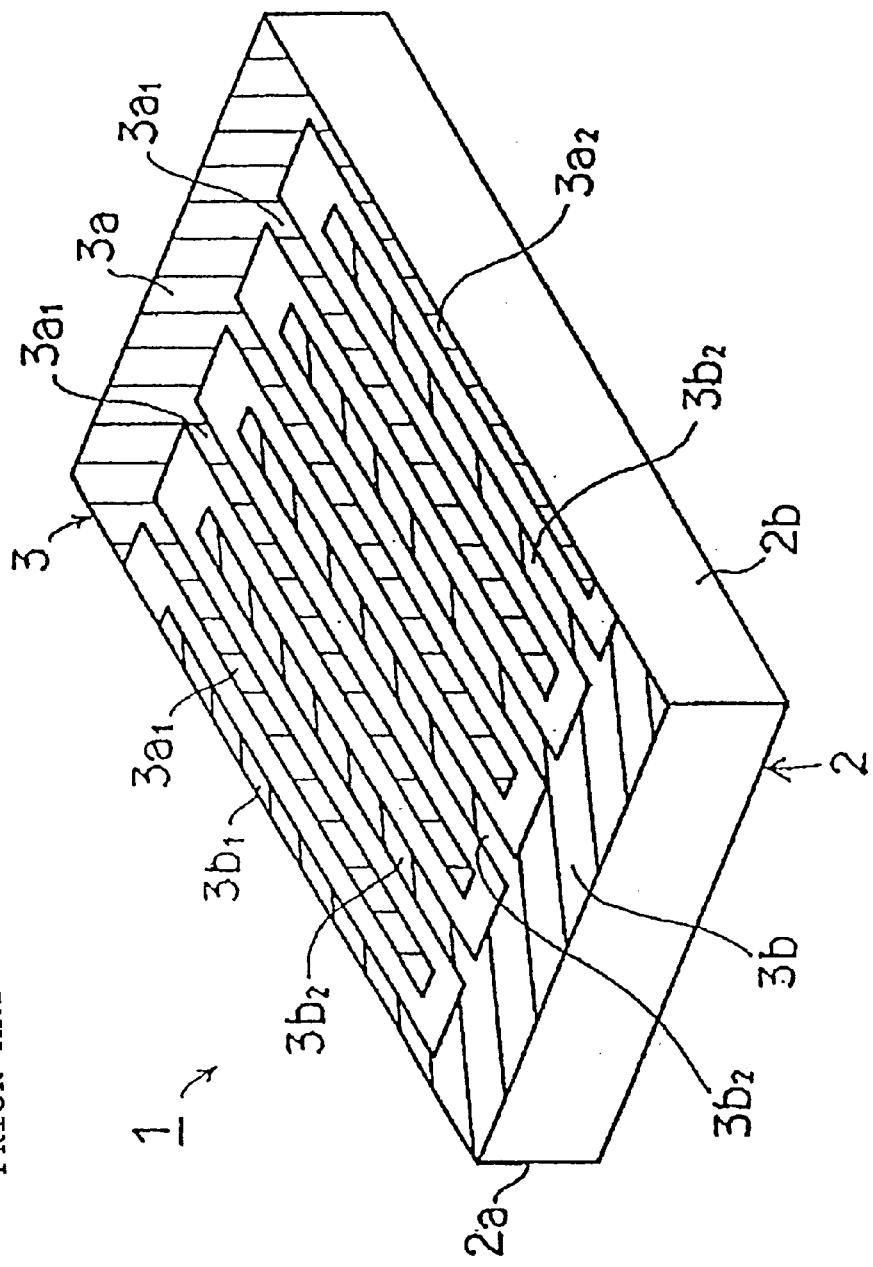
FIG. 3 is a perspective view showing an edge reflection type surface acoustic wave resonator as an example of the edge reflection type surface acoustic wave device, obtained according to preferred embodiments of the present invention.
Figure 4:
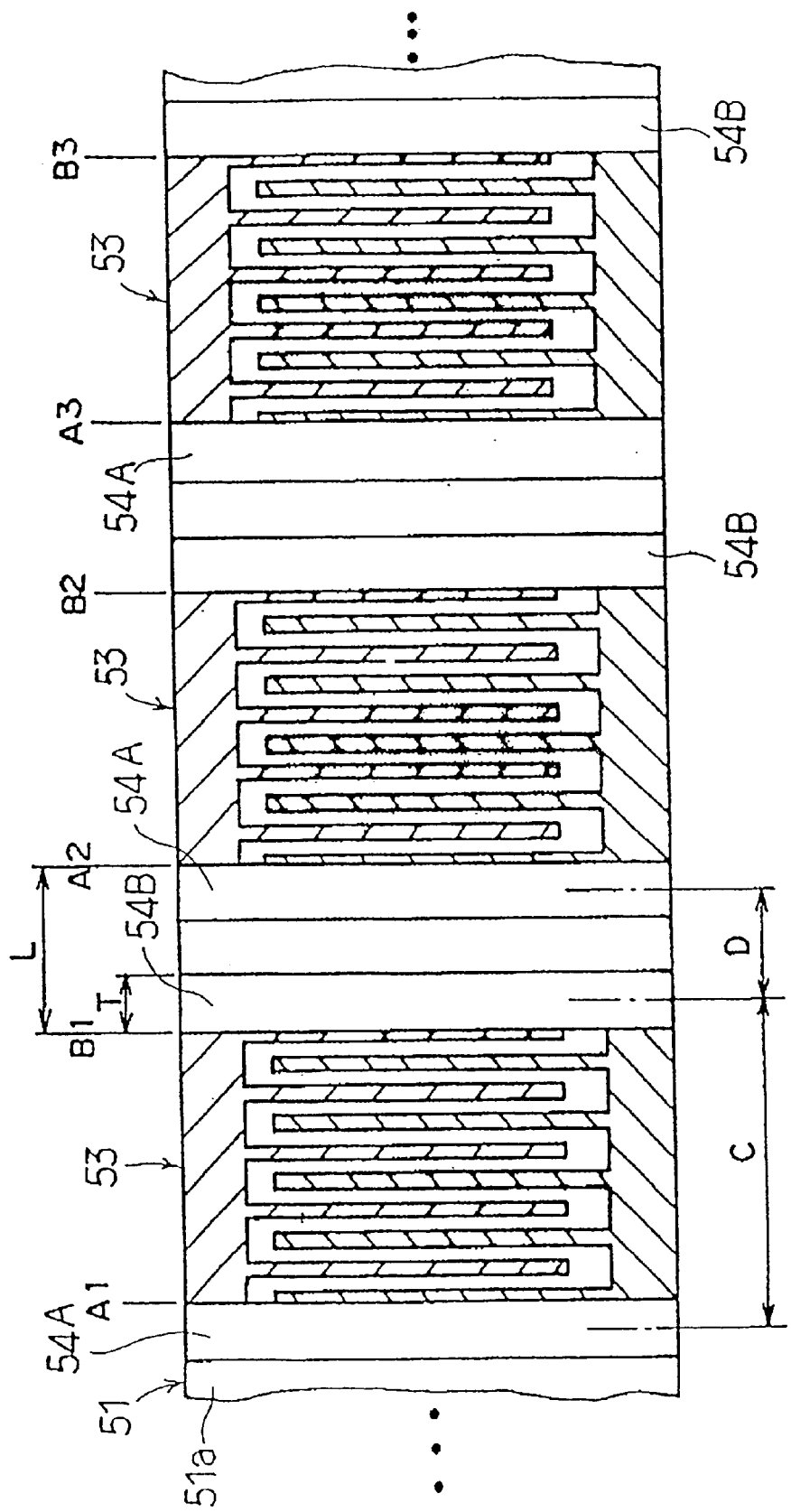
FIG. 4 is a partial cutaway plan view illustrating a method of producing a conventional edge reflection type surface acoustic wave device.

FIG. 1 is a schematic plan view showing a method of producing a surface acoustic wave device according to a preferred embodiment of the present invention. In this preferred embodiment, an end-surface reflection type surface acoustic wave device 1 utilizing an SH type surface acoustic wave as shown in FIG. 3 is produced. The SH type surface acoustic waves used in this device may include a BGS wave, a Love wave, a leaky wave, or other such SH waves.

In this preferred embodiment, the first step of the method involves preparing a surface acoustic wave mother substrate 11. The surface acoustic wave mother substrate 11 is partially shown in FIG. 1, and extends in the direction indicated by the arrow X in FIG. 1.

The surface acoustic wave mother substrate 11 may be made of a piezoelectric single crystal substrate of $LiNbO_3$, $LiTaO_3$, or quartz, or a piezoelectric ceramic substrate made of lead titanate zirconate type ceramic or other suitable material. In addition, the surface acoustic wave mother substrate 11 is not limited to the piezoelectric substrates described above and may be formed by laminating a piezoelectric thin film such as a ZnO thin film or other suitable film onto an insulation substrate or a piezoelectric substrate.

In this preferred embodiment, the surface acoustic wave mother substrate 11 preferably includes a piezoelectric single crystal substrate. A plurality of IDTs 3 are formed at a predetermined distance L on the surface acoustic wave mother substrate 11. The IDTs 3 may be formed by forming a metallic film of Al or other suitable material on the upper side of the surface acoustic wave mother substrate 2, and then, patterning the metallic film via photolithography or other suitable process.

The description of the shape and size of each IDT 3 will be omitted, since the explanation of the end-surface reflection type surface acoustic wave resonator 1, made in reference to FIG. 3, can be applied.

Figure 2:
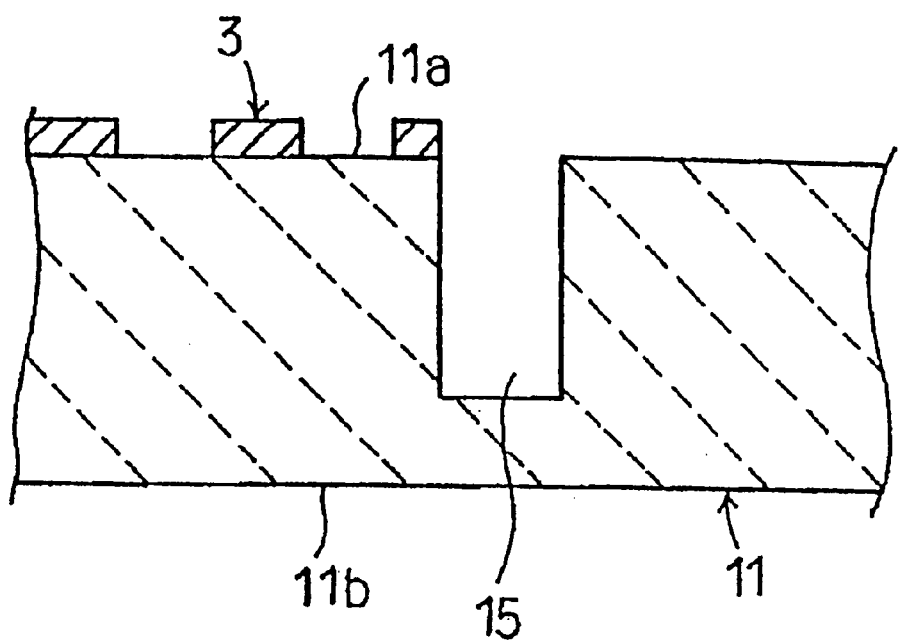
FIG. 2 is a schematic cross section illustrating the process of cutting a surface acoustic wave mother substrate to form a cut groove and a reflection edge.

Referring to the surface acoustic wave substrate 2 having the structure in which a piezoelectric thin film is laminated to the aforementioned insulation substrate or piezoelectric substrate, the IDTs 3 may be formed on the upper side or the underside of the piezoelectric thin film. When the IDTs 3 are formed on the under side of the piezoelectric thin film, the IDTs 3 are formed prior to the lamination of the piezoelectric thin film Next, cut grooves 15 are formed on the surface acoustic wave mother substrate 11 by a cutting device 14 such as a dicing saw or other suitable cutting device. The cut grooves 15 are formed on the surface acoustic wave mother substrate 11 from the upper side 11a which is the one main surface thereof. Preferably, the cut grooves 15 are formed on the surface acoustic wave substrate 11 beginning from the upper side 11a thereof, and extending into the depth or body of the substrate 11 to a point which does not reach the lower surface 11b of the surface acoustic wave substrate 11, as shown in the, cross-section of FIG. 2. The cut grooves 15 are formed so that the inner side walls lying on the IDT 3 sides of the cut grooves 15 form the first reflection end surfaces, respectively. In FIG. 1, the position of the reflection end surface is indicated by the line A1. That is, the lines A1, A2, and A3 in FIG. 1 indicate the positions of the first reflection end surfaces 2a of the end surface reflection type surface acoustic wave resonators 1, respectively.

In this preferred embodiment, the cutting device 14 is preferably fed in the direction X in FIG. 1 while the surface acoustic wave substrate 11 is fixed, whereby the cut grooves 15 are sequentially formed. In this case, all the pitches between the cut grooves 15 are preferably substantially equal. Each of the pitches between the cut grooves 15 is substantially equal to the distance between the lines A1 and A2, and also to that between the lines A2 and A3. That is, the pitch is equal to the pitch C+D shown in FIG. 1. Accordingly, when the cut grooves 15 are sequentially formed, the cutting device 14 may be fed at a pitch C+D in the direction X for the cutting. Thus, the plurality of cut grooves 15 can be formed easily with high precision such that it is unnecessary to change the feeding pitch of the cutting device 14. The plurality of cut grooves 15 are formed in this manner such that the first reflection end surfaces 2a of the respective end surface reflection type surface acoustic wave resonators are formed by the cutting.

Next, the surface acoustic wave substrate 11 is rotated by 180 degrees about the axis as a center, passing through the centers of one main surface and the other main surface thereof. Thereafter, in order to form the second reflection end surfaces of the respective end surface reflection type surface acoustic wave resonators, plural cut grooves 16 are sequentially formed. The cut grooves 16 are formed similarly to the cut grooves 15. The inner side-walls lying on the IDT 3 sides of the cut grooves 16 constitute the second reflection end surfaces 2b of the end surface reflection type surface acoustic wave resonators 1, respectively. The positions of the inner side walls on the IDT 3 sides of the cut grooves 16 are indicated by the lines B1, B2, and B3, respectively. When the cut grooves 16 are formed, the cutting device 14 is sequentially fed in the direction indicated by the arrow X while the surface acoustic wave substrate 2 is fixed. In this case, the pitch between adjacent cut grooves 16 is expressed by C+D. That is, all of the pitches are preferably substantially equal. Further, the feeding quantity of the cutting device used to sequentially form the cut grooves 15 to define the first reflection end surfaces is substantially equal to that when the cut grooves 16 are formed.

Accordingly, a plurality of cut grooves 16 are formed such that the second reflection end surfaces 2b can be formed without changing the feeding-pitch of the cutting device 14.

Thus, in this preferred embodiment, the cut grooves 15, 16, that is, the reflection end surfaces 2a, 2b can be formed without changing the feeding-pitch of the cutting device 14. Accordingly, the productivity and efficiency of manufacturing of the end surface reflection type surface acoustic wave resonator 1 is greatly improved, and moreover, the distance between the end surfaces 2a and 2b is maintained with high precision.

In the above-described preferred embodiment, the cutting device 14 is moved in the direction X, and the cut grooves 15 and 16 are cut. However, the plurality of cut grooves 15 and 16 may be sequentially formed by moving the surface acoustic wave substrate 11 in the direction X, instead of moving the cutting device 14.

In the above-described preferred embodiment, a method of producing an end surface reflection type surface acoustic wave resonator 1 having one IDT 3 as the end surface reflection type surface acoustic wave device is described. The present invention can be applied to the production of an end surface reflection type surface acoustic wave devices utilizing various SH types of surface acoustic waves, such as an end surface reflection type surface acoustic wave filter provided with a plurality of IDTs, or other suitable structure.

In the case in which the above-described cut grooves 15, 16 are formed so as not to reach the other main surface 11b, each of the end surface reflection type surface acoustic wave resonators 1 can be obtained by further cutting the surface acoustic wave substrate portions which are located below the cut grooves 15, 16, or the surface acoustic wave portions located outside of the respective cut grooves 15, 16 with respect to the IDTs 3, or by breaking the surface acoustic wave substrate portions which lie below the cut grooves 15, 16, after the above-described cut grooves 15, 16 are formed. The reason that the surface acoustic wave substrate portions located on the outer sides of the cut grooves 15, 16 with respect to the IDTs 3 are cut, or the surface acoustic wave substrate portions located below the cut grooves 15, 16 are cut or broken after the cut grooves 15, 16 are formed, is as follows. The reflection end surfaces can be formed with high precision, because the cut grooves 15, 16 are formed so as not to reach the lower surface 11b of the surface acoustic wave substrate 11. However, even if the above-described cut grooves 15, 16 are formed so as to reach the other main surface 11b, many end surface reflection type surface acoustic wave devices can be efficiently produced from the surface acoustic wave mother substrate with a high productivity.

In the above preferred embodiments, the cutting device 14 may include appropriate cutting devices such as a dicing saw, a wire saw, a scriber, or other suitable tools.

In the above-described preferred embodiment, the cut grooves 15, 16 are formed for the purpose of forming the above-described reflection end surfaces 2a, 2b. Accordingly, the cut grooves 15, 16, not limited to any certain width, and may be linear, having substantially a negligible width, for example.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of producing a plurality of edge reflection type surface acoustic wave devices having first and second reflection edges opposed to each other, the method comprising the steps of:

preparing a surface acoustic wave mother substrate having two main surfaces and a plurality of interdigital transducers formed on one of the two main surfaces thereof;

repeatedly forming a plurality of first cut grooves on the surface acoustic wave mother substrate on the one of the two main surfaces thereof such that the first reflection edges of the respective surface acoustic wave devices are sequentially formed; and after completing the step of repeatedly forming the plurality of first cut grooves, repeatedly forming a plurality of second cut grooves on the surface acoustic wave mother substrate on the one of the two main surfaces thereof such that the second reflection edges of the respective surface acoustic wave devices are sequentially formed.

2. The method according to claim 1, wherein the step of forming the first reflection edges sequentially and the step of forming the second reflection edges sequentially includes feeding a cutting device or the surface acoustic wave mother substrate sequentially in a direction passing through the first and second reflection edges whereby the first or the second reflection edges are sequentially formed.

3. The method according to claim 2, wherein a feeding-pitch of the cutting device or the surface acoustic wave mother substrate when forming the first reflection edges is substantially equal to the feeding-pitch of the cutting device or the surface acoustic wave mother substrate when forming the second reflection edges.

4. The method according to claim 1, wherein a distance between adjacent pairs of the first reflection edges is equal for all of the adjacent pairs of the first reflection edges.

5. The method according to claim 1, wherein a distance between adjacent pairs of the second reflection edges is equal for all of the adjacent pairs of the second reflection edges.

6. The method according to claim 5, wherein a distance between adjacent pairs of the first reflection edges is equal for all of the adjacent pairs of the first refection edges.

7. The method according to claim 1, wherein the cut grooves extend in a depth direction from the one main surface of the surface acoustic wave mother substrate toward the other of the two main surfaces of the surface acoustic wave mother substrate to a point spaced from the other main surface of the surface acoustic wave mother substrate.

8. The method according to claim 1, wherein the surface acoustic wave device is formed to generate Shear Horizontal waves.

9. The method according to claim 1, further comprising the step of rotating the surface acoustic wave mother substrate by 180 degrees about an axis passing through a center of both of the two main surfaces of the surface acoustic wave mother substrate after the first reflection edges are sequentially formed, whereby the second reflection edges are formed sequentially on the rotated surface acoustic wave mother substrate.

10. The method according to claim 1, wherein the surface acoustic wave mother substrate is made of one of a piezo-electric single crystal material and a piezoelectric ceramic material.

11. The method according to claim 1, wherein the surface acoustic wave mother substrate includes a thin film laminated thereon.

12. The method according to claim 1, further comprising the step of separating the respective surface acoustic wave devices from the mother substrate.

13. The method according to claim 12, wherein the step of separating the respective surface acoustic wave devices from the mother substrate includes one of cutting a portion of the surface acoustic wave mother substrate at locations of the cut grooves, cutting a portion of the surface acoustic wave mother substrate at locations outside of the cut grooves and breaking the surface acoustic wave mother substrate along the cut grooves.

14. A method of producing a plurality of edge reflection type surface acoustic wave devices having first and second reflection edges opposed to each other, the method comprising the steps of:

preparing a surface acoustic wave mother substrate having two main surfaces and a plurality of interdigital transducers formed on one of the two main surfaces thereof;

feeding one of a cutting device and the surface acoustic wave mother substrate at a first feeding pitch and forming a plurality of first cut grooves on the surface acoustic wave mother substrate on the one main surface thereof such that the first reflection edges of the respective surface acoustic wave devices are sequentially formed; and feeding one of the cutting device and the surface acoustic wave mother substrate at a second feeding pitch and forming a plurality of second cut grooves on the surface acoustic wave mother substrate on the one main surface thereof such that the second reflection edges of the respective surface acoustic wave devices are sequentially formed; wherein the first feeding pitch is substantially equal to the second feeding pitch.

15. The method according to claim 14, wherein a distance between adjacent pairs of the first reflection edges is equal for all of the adjacent pairs of the first reflection edges.

16. The method according to claim 15, wherein a distance between adjacent pairs of the second reflection edges is equal for all of the adjacent pairs of the first reflection edges.

17. The method according to claim 14, wherein a distance between adjacent pairs of the second reflection edges is equal for all of the adjacent pairs of the second reflection edges.

18. The method according to claim 14, wherein the cut grooves extend in a depth direction from the one main surface of the surface acoustic wave mother substrate toward the other of the two main surfaces of the surface acoustic wave mother substrate to a point spaced from the other main surface of the surface acoustic wave mother substrate.

19. The method according to claim 14, wherein the surface acoustic wave device is formed to generate Shear Horizontal waves.

20. The method according to claim 14, further comprising the step of rotating the surface acoustic wave mother substrate by 180 degrees about an axis passing through a center of both of the two main surfaces of the surface acoustic wave mother substrate after the first reflection edges are sequentially formed, whereby the second reflection edges are formed sequentially on the rotated surface acoustic wave mother substrate.

21. The method according to claim 14, further comprising the step of separating the respective surface wave devices from the mother substrate.

22. The method according to claim 21, wherein the step of separating the respective surface acoustic wave devices from the mother substrate includes one of cutting a portion of the surface acoustic wave mother substrate at locations of the cut grooves, cutting a portion of the surface acoustic wave mother substrate at locations outside of the cut grooves and breaking the surface acoustic wave mother substrate along the cut grooves.

23. A method of producing a plurality of edge reflection type surface acoustic wave devices having first and second reflection edges opposed to each other, the method comprising the steps of:

preparing a surface acoustic wave mother substrate having, two main surfaces and a plurality of interdigital transducers formed on one of the two main surfaces thereof;

repeatedly forming a plurality of first cut grooves on the surface acoustic wave mother substrate on the one main surface thereof such that the first reflection edges of the respective surface acoustic wave devices are sequentially formed;

repeatedly forming a plurality of second cut grooves on the surface acoustic wave mother substrate on the one main surface thereof such that the second reflection edges of the respective surface acoustic wave devices are sequentially formed; and rotating the surface acoustic wave mother substrate by 180 degrees about an axis passing through a center of both of the two main surfaces of the surface acoustic wave mother substrate after the first reflection edges are sequentially formed, such that the second reflection edges are formed sequentially on the rotated surface acoustic wave mother substrate.

24. The method according to claim 23, wherein the step of forming the first reflection edges sequentially and the step of forming the second reflection edges sequentially includes feeding a cutting device or the surface acoustic wave mother substrate sequentially in a direction passing through the first and second reflection edges whereby the first or the second reflection edges are sequentially formed.

25. The method according to claim 24, wherein a feeding-pitch of the cutting device or the surface acoustic wave mother substrate when forming the first reflection edges is substantially equal to the feeding pitch of the cutting device of the surface acoustic wave mother substrate when forming the second reflection edges.

26. The method according to claim 23, wherein a distance between adjacent pairs of the first reflection edges is equal for all of the adjacent pairs of the first reflection edges.

27. The method according to claim 23, wherein a distance between adjacent pairs of the second reflection edges is equal for all of the adjacent pairs of the second reflection edges.

28. The method according to claim 27, wherein a distance between adjacent pairs of the first reflection edges is equal for all of the adjacent pairs of the first reflection edges.

29. The method according to claim 23, wherein the cut grooves extend in a depth direction from the one main surface of the surface acoustic wave mother substrate toward the other of the two main surfaces of the surface acoustic wave mother substrate to a point spaced from the other main surface of the surface acoustic wave mother substrate.

30. The method according to claim 23, wherein the plurality of surface acoustic wave devices are formed to generate Shear Horizontal waves.

31. The method according to claim 23, wherein the surface acoustic wave mother substrate is made of one of a piezoelectric single crystal material and a piezoelectric ceramic material.

32. The method according to claim 23, wherein the surface acoustic wave mother substrate includes a thin film laminated thereon.

33. The method according to claim 23, further comprising the step of separating the respective surface acoustic wave devices from the mother substrate.

34. The method according to claim 33, wherein the step of separating the respective surface acoustic wave devices from the mother substrate includes one of cutting a portion of the surface acoustic wave mother substrate at locations of the cut grooves, cutting a portion of the surface acoustic wave mother substrate at locations outside of the cut grooves and breaking the surface acoustic wave mother substrate along the cut grooves.

* * * * *